US010249736B2

(12) United States Patent
Leobandung et al.

(10) Patent No.: US 10,249,736 B2
(45) Date of Patent: Apr. 2, 2019

(54) ASPECT RATIO TRAPPING IN CHANNEL LAST PROCESS

(71) Applicant: INTERNATIONAL BUSINESS MACHINES CORPORATION, Armonk, NY (US)

(72) Inventors: Effendi Leobandung, Stormville, NY (US); Chun-chen Yeh, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 46 days.

(21) Appl. No.: 15/182,942

(22) Filed: Jun. 15, 2016

(65) Prior Publication Data

US 2017/0365692 A1    Dec. 21, 2017

(51) Int. Cl.
*H01L 21/02*    (2006.01)
*H01L 29/16*    (2006.01)
(Continued)

(52) U.S. Cl.
CPC .. *H01L 29/66795* (2013.01); *H01L 21/02381* (2013.01); *H01L 21/02428* (2013.01); *H01L 21/02494* (2013.01); *H01L 21/02543* (2013.01); *H01L 21/02546* (2013.01); *H01L 21/30604* (2013.01); *H01L 21/31105* (2013.01);
(Continued)

(58) Field of Classification Search
CPC ......... H01L 29/66795; H01L 21/30604; H01L 21/02381; H01L 21/02428; H01L 21/02494; H01L 21/02546; H01L 29/7853; H01L 29/7851; H01L 21/31105; H01L 29/20; H01L 29/16; H01L 29/32; H01L 29/66545
See application file for complete search history.

(56) References Cited

U.S. PATENT DOCUMENTS 7,977,706 B2    7/2011   Lochtefeld
8,274,097 B2    9/2012   Cheng et al.
(Continued)

OTHER PUBLICATIONS

Dai, X. et al., "Novel Heterogeneous Integration Technology of III-V Layers and InGaAs FinFETs to Silicon" Advanced Fuctional Materials (2014) pp. 1-7.
(Continued)

*Primary Examiner* — Moazzam Hossain
*Assistant Examiner* — Stanetta D Isaac
(74) *Attorney, Agent, or Firm* — Tutunjian & Bitetto, P.C.; L Jeffrey Kelly

(57) ABSTRACT

A method of forming the fin structure that includes forming a replacement gate structure on a channel region of the at least one replacement fin structure; and forming an encapsulating dielectric encapsulating the replacement fin structure leaving a portion of the replacement gate structure exposed. The exposed portion of the replacement gate structure is etched to provide an opening through the encapsulating dielectric to the replacement fin structure. The replacement fin structure is etched selectively to the dielectric to provide a fin opening having a geometry dictated by the encapsulating dielectric. Functional fin structures of a second semiconductor material is epitaxially grown on the growth surface of the substrate substantially filling the fin opening.

15 Claims, 14 Drawing Sheets

(51) Int. Cl.
  *H01L 29/20* (2006.01)
  *H01L 29/32* (2006.01)
  *H01L 29/66* (2006.01)
  *H01L 29/78* (2006.01)
  *H01L 21/306* (2006.01)
  *H01L 21/311* (2006.01)

(52) U.S. Cl.
  CPC .............. *H01L 29/16* (2013.01); *H01L 29/20* (2013.01); *H01L 29/32* (2013.01); *H01L 29/66545* (2013.01); *H01L 29/7851* (2013.01); *H01L 29/7853* (2013.01)

(56) References Cited

U.S. PATENT DOCUMENTS

| | | |
|---|---|---|
| 8,329,541 B2 | 12/2012 | Ye et al. |
| 8,624,326 B2 | 1/2014 | Chen et al. |
| 8,836,016 B2 | 9/2014 | Wu et al. |
| 8,937,299 B2 | 1/2015 | Basu et al. |
| 2013/0099282 A1* | 4/2013 | Chen ................ H01L 29/66795 257/190 |
| 2014/0042500 A1* | 2/2014 | Wann ................ H01L 29/41791 257/288 |
| 2014/0191318 A1* | 7/2014 | Lin ................ H01L 21/823821 257/344 |
| 2014/0213037 A1 | 7/2014 | LiCausi et al. |
| 2015/0123166 A1 | 5/2015 | Jacob et al. |

OTHER PUBLICATIONS

Park, J.S. et al., "Defect reduction of selective Ge epitaxy in trenches on Si(001) substrates using aspect ratio trapping" Applied Physics Letters (2007) pp. 052113-1-052113-3, vol. 90.

* cited by examiner

ASPECT RATIO TRAPPING IN CHANNEL LAST PROCESS

BACKGROUND

Technical Field

The present disclosure relates to semiconductor devices, and more particularly to semiconductor devices including fin structures composed of III-V semiconductor materials.

Description of the Related Art

With the continuing trend towards miniaturization of integrated circuits (ICs), there is a need for transistors to have higher drive currents with increasingly smaller dimensions. The use of non-planar semiconductor devices such as, for example, silicon fin field effect transistors (FinFETs) may be the next step in the evolution of complementary metal oxide semiconductor (CMOS) devices.

SUMMARY

In one aspect, the present disclosure provides a method of forming a fin structure. In one embodiment, the method of forming the fin structure may include forming at least one replacement fin structures from a semiconductor substrate of a first semiconductor material. A replacement gate structure is formed on a channel region of the at least one replacement fin structure. An encapsulating dielectric is formed on the substrate and the at least one replacement gate structure, wherein the encapsulating dielectric encapsulates the replacement fin structure and a portion of the replacement gate structure is exposed. The portion of the replacement gate structure that is exposed is etched to provide an opening through the encapsulating dielectric to the replacement fin structure. The replacement fin structure is then etched selectively to the encapsulating dielectric to provide a fin opening having a geometry dictated by the encapsulating dielectric that exposes a growth surface of the substrate. Functional fin structures of a second semiconductor material are epitaxially grown on the growth surface of the substrate substantially filling the fin opening.

In one aspect, the present disclosure provides a method of forming a semiconductor device including a fin structure is provided. In one embodiment, the method of forming the fin structure may include forming a replacement gate structure on a channel region of the at least one replacement fin structure. An encapsulating dielectric is formed encapsulating the replacement fin structure and a portion of the replacement gate structure is exposed. The portion of the replacement gate structure that is exposed is etched to provide an opening through the encapsulating dielectric to the replacement fin structure. The replacement fin structure is then etched selectively to the encapsulating dielectric to provide a fin opening. Functional fin structures of a second semiconductor material are epitaxially grown on a growth surface of the substrate exposed by the fin opening. Source and drain regions are formed to the source and drain portions of the functional fin structure. A remaining portion of the replacement gate structure is replaced with a functional gate structure.

In yet another aspect, a semiconductor device is provided including a plurality of type III-V fin structures. In one embodiment, the semiconductor device includes a substrate of a type IV semiconductor material having a trench present therein. A plurality of type III-V fin structures joined by an epitaxial base portion is present within the trench of the type IV semiconductor material. The epitaxial base portion in epitaxial relationship with the trench of the type IV semiconductor substrate. A gate structure is present on a channel region portion of the type III-V fin structures. Source and drain regions are present on source and drain region portions of the type III-V fin structures.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1A:
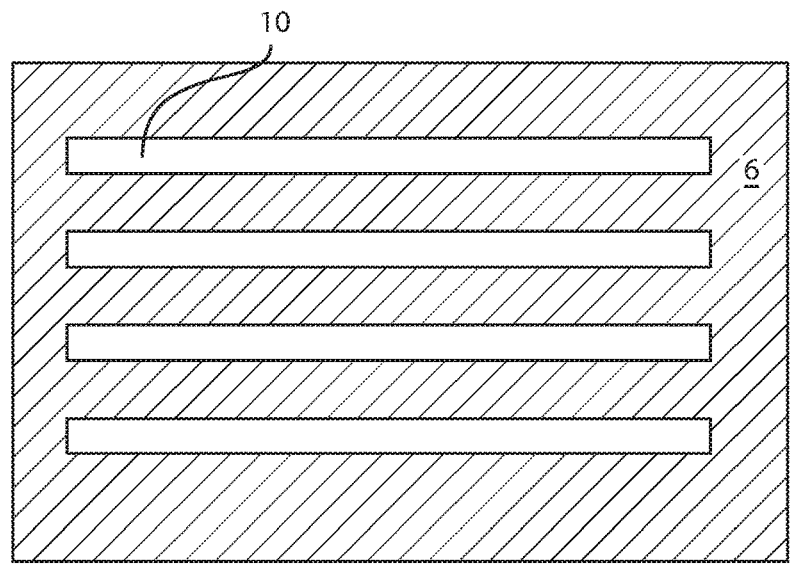
FIG. 1A is a top down planar view depicting forming a plurality of replacement fin structures from a bulk semiconductor substrate and forming shallow trench isolation regions separating the adjacent replacement fin structures, in accordance with one embodiment of the present disclosure.

Detailed embodiments of the claimed methods, structures and computer products are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment. For purposes of the description hereinafter, the terms "upper", "over", "overlying", "lower", "under", "underlying", "right", "left", "vertical", "horizontal", "top", "bottom", and derivatives thereof shall relate to the embodiments of the disclosure, as it is oriented in the drawing figures. The term "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

The structures and methods that are disclosed herein provide a fin structure composed of III-V semiconductor materials. The fin structure may be used in the channel region of a semiconductor device, such as a field effect transistor (FET). A field effect transistor (FET) is a semiconductor device in which output current, i.e., source-drain current, is controlled by the voltage applied to a gate structure to the semiconductor device. A field effect transistor has three terminals, i.e., gate structure, source region and drain region. A finFET is a semiconductor device that positions the channel region of the semiconductor device in a fin structure. As used herein, the term "drain" means a doped region in semiconductor device located at the end of the channel region, in which carriers are flowing out of the transistor through the drain. The term "source" is a doped region in the semiconductor device, in which majority carriers are flowing into the channel region.

III-V semiconductor materials are being touted as viable channel materials for continued CMOS scaling due to their high electron mobility. By "III-V semiconductor material" it is meant that the semiconductor material includes at least one element from Group IIIA (i.e., Group 13) of the Periodic Table of Elements and at least one element from Group VA (i.e., Group 15) of the Periodic Table of Elements. In some embodiments, the fin structures provided by the methods and structures of the present disclosure are composed of epitaxially semiconductor materials that have low defect density. The term "epitaxial semiconductor material" denotes a semiconductor material that has been formed using an epitaxial deposition or growth process. "Epitaxial growth and/or deposition" means the growth of a semiconductor material on a deposition surface of a semiconductor material, in which the semiconductor material being grown has substantially the same crystalline characteristics as the semiconductor material of the deposition surface. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

To provide a low defect density, the epitaxially formed III-V semiconductor materials for the fin structures can be formed using aspect ratio trapping (ART). In ART process, III-V semiconductor materials are epitaxially grown in a dielectric trench by using the exposed silicon at the trench bottom as the seed. Epitaxy defects due to the large lattice mismatch between epitaxial III-V semiconductor material and the semiconductor containing deposition surface is trapped in the lower portion of the trench, resulting in virtually defect-free III-V semiconductor in upper portion of trench. In some embodiments, it can be beneficial to do aspect ratio trapping as late in the manufacturing process of semiconductor devices as possible. In some embodiments, the methods disclosed herein integrate aspect ratio trapping (ART) process steps with replacement gate process steps. The methods and structures of the present disclosure are now discussed with more detail referring to FIGS. 1A-8C.

Figure 1B:
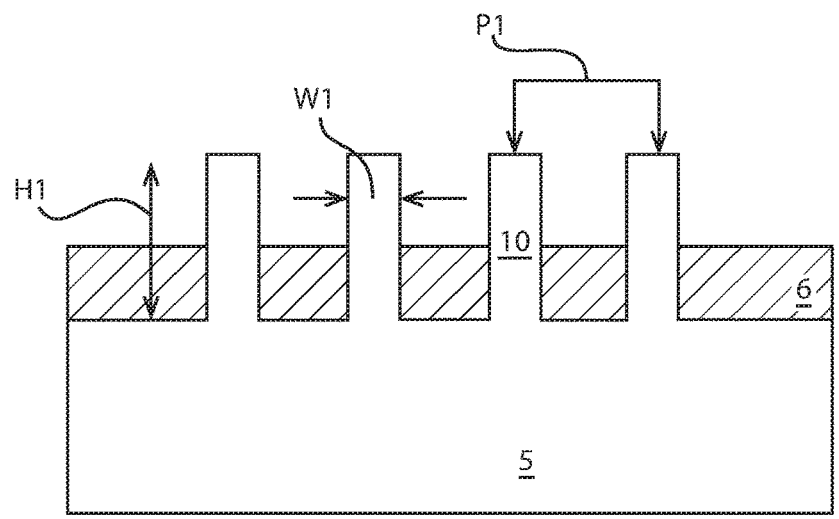
FIG. 1B is a side cross-sectional view along section line A-A of FIG. 1A.

FIGS. 1A and 1B depict forming a plurality of replacement fin structures 10 from a bulk semiconductor substrate 5, and forming shallow trench isolation regions 6 separating the adjacent replacement fin structures 10.

The term "replacement" as used to describe the fin structures 10 denotes that the fin structures are not present in the final device that is produced by the method described herein. The "replacement" fin structure defines the geometry of a later formed functional fin structure that functions to provide at least the channel region of the device.

The semiconductor substrate 5 that is depicted in FIGS. 1A and 1B may be provided by any semiconductor material. In some embodiments, the semiconductor material of the semiconductor substrate 5 is a type IV semiconductor. By "type IV semiconductor" it is meant that the semiconductor material includes at least one element from Group IVA (i.e., Group 14) of the Periodic Table of Elements. Examples of type IV semiconductor materials that are suitable for the semiconductor substrate 5 include silicon (Si), germanium (Ge), silicon germanium (SiGe), silicon doped with carbon (Si:C), silicon germanium doped with carbon (SiGe:C) and a combination thereof. The semiconductor substrate 5 may be a bulk substrate.

The plurality of replacement fin structures 10 may be formed from the semiconductor substrate 5 using photolithography and etch processes. In one embodiment, the patterning process used to define each of the replacement fin structures 10 is a sidewall image transfer (SIT) process. The SIT process can include forming a mandrel material layer (not shown) on the material layer that provides the replacement fin structures 10, such as the bulk semiconductor substrate upper surface. The mandrel material layer can include any material (semiconductor, dielectric or conductive) that can be selectively removed from the structure during a subsequently performed etching process. In one embodiment, the mandrel material layer may be composed of amorphous silicon or polysilicon. In another embodiment, the mandrel material layer may be composed of a metal, such as, e.g., aluminum (Al), tungsten (W), or copper (Cu). The mandrel material layer can be formed by a deposition method, such as chemical vapor deposition or plasma enhanced chemical vapor deposition. In one embodiment, the thickness of the mandrel material layer can be from 50 nm to 300 nm. Following deposition of the mandrel material layer, the mandrel material layer can be patterned by lithography and etching to form a plurality of mandrel structures on the topmost surface of the semiconductor containing material that provides the replacement fin structures 10, e.g., the bulk semiconductor substrate 5.

In some embodiments, the SIT process may continue by forming a dielectric spacer on each sidewall of each mandrel structure. The dielectric spacer can be formed by deposition of a dielectric spacer material, and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, but are not limited to, chemical vapor deposition (CVD), plasma enhanced chemical vapor deposition (PECVD), or atomic layer deposition (ALD). Examples of etching that be used in providing the dielectric spacers include any etching process, such as, e.g., reactive ion etching (RIE). Since the dielectric spacers are used in the SIT process as an etch mask, the width of the each dielectric spacer determines the width of each replacement fin structure 10.

In some embodiments, after formation of the dielectric spacers, the SIT process continues by removing each mandrel structure. Each mandrel structure can be removed by an etching process that is selective for removing the mandrel material as compared to silicon. Following the mandrel structure removal, the SIT process continues by transferring the pattern provided by the dielectric spacers into the semiconductor material layer that provides the replacement fin structures 10, such as the bulk semiconductor substrate 5. The pattern transfer may be achieved by utilizing at least one etching process that can include dry etching, such as reactive ion etching (RIE), plasma etching, ion beam etching or laser ablation, chemical wet etch processes or a combination thereof. In one example, the etch process used to transfer the pattern may include one or more reactive ion etching (RIE) steps. The etching steps pattern the semiconductor material layer to provide the replacement fin structures 10. Following etching, i.e., pattern transfer, the SIT process may conclude with removing the dielectric spacers using an etch process or a planarization process.

It is noted that the aforementioned spacer image transfer (SIT) process is only one method of forming the replacement fin structures 10. In another embodiment, each of the replacement fin structures 10 may be formed using a photoresist etch mask. Specifically, in one example, a photoresist mask is formed overlying the semiconductor composition layer which provides the replacement fin structures 10. The exposed portions of the semiconductor layer that provides the replacement fin structures 10 that are not protected by the photoresist mask are removed using a selective etch process. To provide the photoresist mask, a photoresist layer is first positioned on the semiconductor layer that provides the replacement fin structure 10, e.g., semiconductor substrate 5. The photoresist layer may be provided by a blanket layer of photoresist material that is formed utilizing a deposition process such as, e.g., plasma enhanced CVD (PECVD), evaporation or spin-on coating.

The blanket layer of photoresist material is then patterned to provide the photoresist mask utilizing a lithographic process that may include exposing the photoresist material to a pattern of radiation and developing the exposed photoresist material utilizing a resist developer. Following the formation of the photoresist mask, an etching process may remove the unprotected portions of the semiconductor layer that provides the replacement fin structures 10. The etch process may be an anisotropic process, such as reactive ion etch (RIE).

Referring to FIGS. 1A and 1B, the replacement fin structures 10 may have a height H1 ranging from 5 nm to 200 nm. In another embodiment, the replacement fin structures 10 may have a height H1 ranging from 10 nm to 100 nm. In one example, the fin structures 10 may have a height H1 ranging from 20 nm to 50 nm. Each of the fin structures 10 may have a width W1 of less than 20 nm. In another embodiment, the fin structures 10 have a width W1 ranging from 3 nm to 8 nm. The pitch P1 separating adjacent replacement fin structures 10 may range from 10 nm to 500 nm. In another example, the pitch separating adjacent replacement fin structures 10 in the plurality of fin structures 5 may range from 20 nm to 50 nm.

The replacement fin structures 10 are typically composed of the same material as the bulk semiconductor substrate 1, i.e., the material from which the replacement fin structures 10 are formed. For example, the replacement fin structures 10 may be composed of a type IV semiconductor material, e.g., a silicon or germanium containing material. In some embodiments, the fin structures 5 may be composed of, but is not limited to silicon, single crystal silicon, multicrystalline silicon, polycrystalline silicon, amorphous silicon, strained silicon, silicon doped with carbon (Si:C), silicon alloys, silicon germanium (SiGe) or germanium (Ge) or any combination thereof.

FIGS. 1A and 1B also depict filling the space between the adjacent replacement fin structures 10 with a fill dielectric material 6 (which may be referred to as dielectric regions 6 or isolation regions). The dielectric regions 6 may be composed of a nitride, oxide, oxynitride material, and/or any other suitable dielectric layer. For example, when the dielectric regions 6 are composed of an oxide, the dielectric regions 6 can be silicon oxide ($SiO_2$). In another example, when the dielectric regions 6 are composed of a nitride, the dielectric regions 6 can be silicon nitride. The dielectric regions 6 can be formed by a deposition process, such as CVD. Variations of CVD processes include, but not limited to, Atmospheric Pressure CVD (APCVD), Low Pressure CVD (LPCVD) and plasma enhanced chemical vapor deposition (PECVD), Metal-Organic CVD (MOCVD) and combinations thereof. Alternatively, the dielectric regions 6 may be formed using a growth process, such as thermal oxidation or thermal nitridation.

The dielectric regions 6 may be recessed using a selective etch process to provide an exposed portion of the upper portion of the replacement fin structures 10. The term "selective" as used to describe a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 100:1 or greater. In some embodiments, the dielectric regions 6 are removed by an etch that is selective to the replacement fin structures 10. The etch process for removing the dielectric regions 6 may be an anisotropic etch or an isotropic etch. In some examples, the etch process may be a wet chemical etch, reactive ion etch (RIE), plasma etch, laser etch and combinations thereof.

Figure 2A:
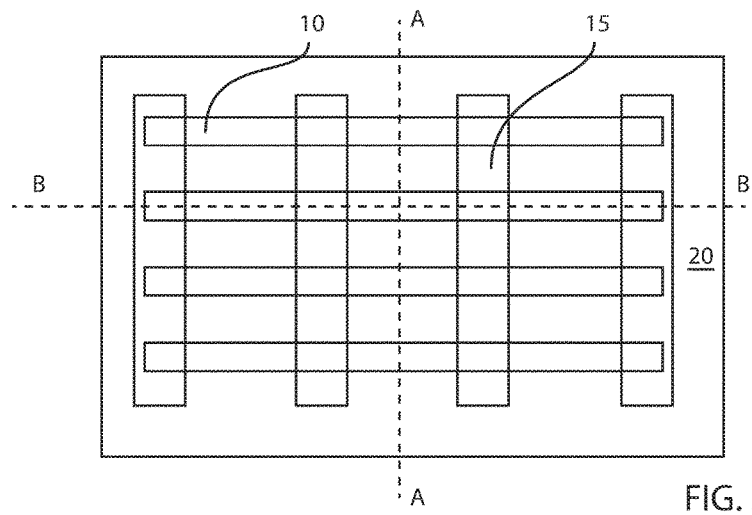
FIG. 2A is a top down planar view depicting forming a plurality of replacement gate structures on the plurality of replacement fin structures; and forming an encapsulating dielectric on the substrate and the at least one replacement gate structure, wherein the encapsulating dielectric encapsulates the replacement fin structure, in accordance with one embodiment of the present disclosure.
Figure 2B:
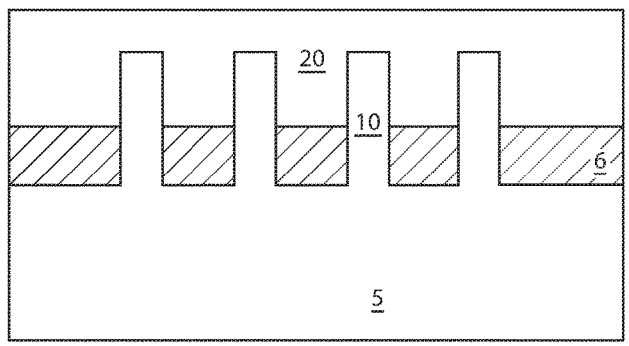
FIG. 2B is a side cross-sectional view along section line A-A of FIG. 1A.
Figure 2C:
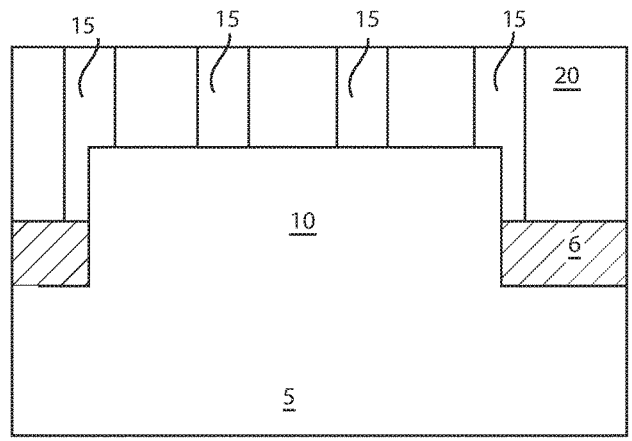
FIG. 2C is a side cross-sectional view along section line B-B of FIG. 1A.
Figure 3A:
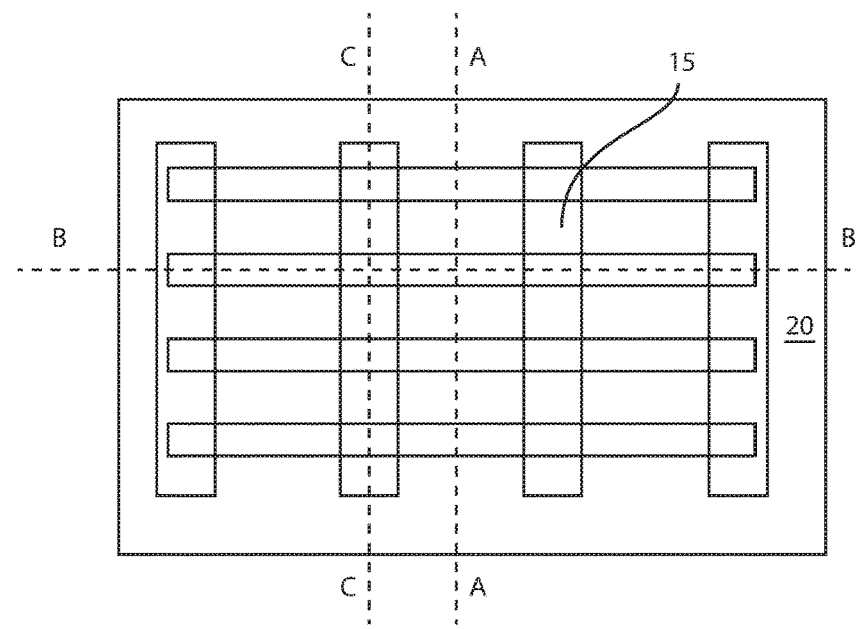
FIG. 3A is a top down planar view depicting etching an exposed portion of the replacement gate structure to provide an opening through the encapsulating dielectric to the replacement fin structure, in accordance with one embodiment of the present disclosure.
Figure 3B:
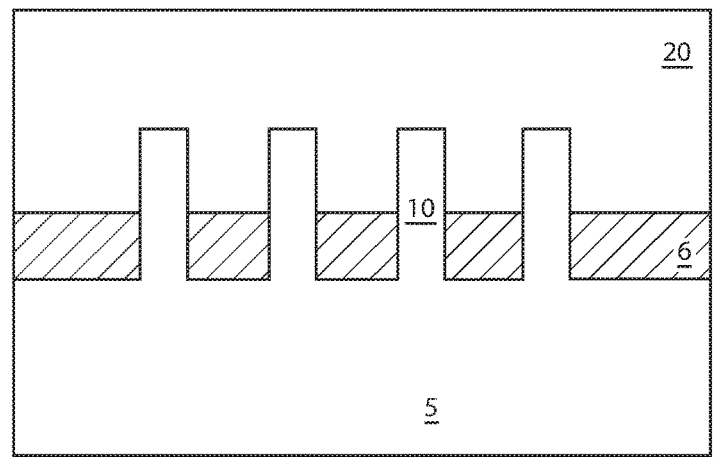
FIG. 3B is a side cross-sectional view along section line A-A of FIG. 3A.
Figure 3C:
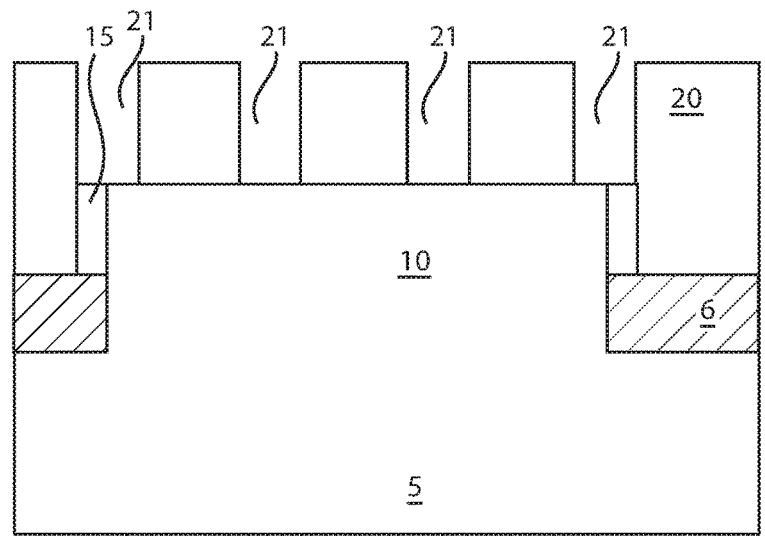
FIG. 3C is a side cross-sectional view along section line B-B of FIG. 3A.
Figure 3D:
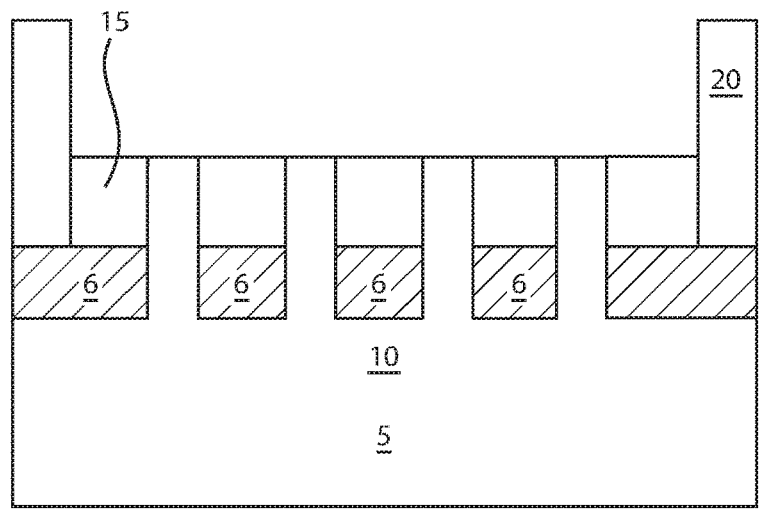
FIG. 3D is a side cross-sectional view along section line C-C of FIG. 3A.

FIGS. 2A-2C depicting forming a plurality of replacement gate structures 15 on the plurality of replacement fin structures 10. The term "replacement" as used to describe the replacement gate conductor denotes that the structure is present during the process sequence, but is not present in the final device structure, in which the replacement structure provides an opening that dictates the size and geometry of a later formed functional gate conductor. The sacrificial material that provides the replacement gate structure 15 may be composed of any material that can be etched selectively to the underlying replacement fin structures 10. In one embodiment, the sacrificial material that provides the replacement gate structure 15 may be composed of a dielectric, such as an oxide, nitride or oxynitride. In one embodiment, in which the replacement fin structure 10 is composed of silicon (Si), the replacement gate structure 15 may be composed of sacrificial material that is a nitride, such as silicon nitride or silicon oxynitride. Although, the replacement gate structure 15 is typically composed of a dielectric material, the s replacement gate structure 15 may also be composed of a semiconductor material.

The sacrificial material may be patterned and etched to provide the replacement gate structure 15. Specifically, and in one example, a pattern is produced by applying a photoresist to the surface to be etched, exposing the photoresist to a pattern of radiation, and then developing the pattern into the photoresist utilizing a resist developer. Once the patterning of the photoresist is completed, the sections of the sacrificial material covered by the photoresist are protected to provide the replacement gate structure 15, while the exposed regions are removed using a selective etching process that removes the unprotected regions. Following formation of replacement gate structure 15, the photoresist may be removed.

FIGS. 2A-2C also depict forming an encapsulating dielectric 20 on the substrate 5, the replacement fin structures 10, and the at least one replacement gate structure 15, wherein the encapsulating dielectric 20 encapsulates the replacement fin structure 10. The encapsulating dielectric 20 may be any non-crystalline material. For example, the encapsulating dielectric 20 may be carbon based, such as amorphous carbon (α-C), or an oxide, such as porous silicon dioxide. It is noted that the above examples of the material compositions for the encapsulating dielectric 20 have been provided for illustrative purposes only, and are not intended to limit the present disclosure. Other dielectric materials are equally applicable to the encapsulating dielectric 20 for the methods and structures disclosed herein, so long as the material may be removed, e.g., etched, selectively to the oxide or nitride compositions of at least the replacement gate structures 15.

The encapsulating dielectric 20 may be formed by deposition, such as chemical vapor deposition, e.g., plasma enhanced chemical vapor deposition, or can be formed using a growth process, such as thermal oxidation. In some other embodiments, the encapsulating dielectric 20 may be deposited using spin on deposition methods. In other embodiments, the encapsulating dielectric 20 may be deposited using spin on deposition. The thickness of the encapsulating dielectric 20 is deposited to at least cover the sidewalls of the replacement gate structures 15. In some embodiments, the upper surface of the encapsulating dielectric 20 is coplanar with the upper surface of the replacement gate structures 15. In other embodiments, the dielectric 20 may be deposited to a thickness that covers the entirety of the replacement gate structure 15, wherein a recessing process step recesses the upper surface of the encapsulating dielectric 20 to be substantially coplanar with the upper surface of the replacement gate structure. The recess process may include etching, e.g., reactive ion etching, or planarization, e.g., chemical mechanical planarization (CMP).

FIGS. 3A-3D depict etching an exposed portion of the replacement gate structure 15 to provide an opening 21 through the encapsulating dielectric 20 to the replacement fin structure 10. In some embodiments, the etch process for removing the exposed portion of the replacement gate structure 15 to provide an opening 21 to the replacement fin structure 10 may be a selective etch process. As used herein, the term "selective" in reference to a material removal process denotes that the rate of material removal for a first material is greater than the rate of removal for at least another material of the structure to which the material removal process is being applied. For example, the etch process for forming the opening 21 may remove the material of the replacement gate structure 15 selectively to the encapsulating dielectric material 20. In some embodiments, the etch process for recessing the exposed portion of the replacement gate structure 15 may also be selective to the replacement fin structure 10. The etch process may be a time etch. In other embodiments, the time period for terminating the etch process may be determined using end point detection. As used herein, an "anisotropic etch process" denotes a material removal process in which the etch rate in the direction normal to the surface to be etched is greater than in the direction parallel to the surface to be etched. One anisotropic etch that can be used during this stage of the present process flow may be reactive ion etching (RIE).

Other examples of anisotropic etching that can be used at this point of the present invention include ion beam etching, plasma etching or laser ablation. In other embodiments, the etch process for recessing the replacement gate structure 15 may be an isotropic etch, such as a wet chemical etch.

Figure 4A:
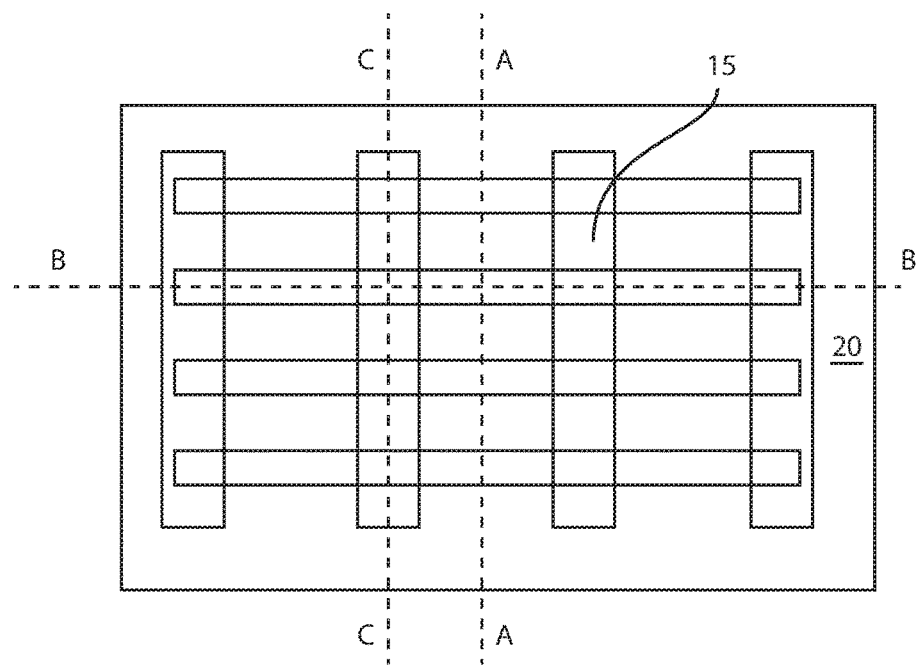
FIG. 4A is a top down planar view depicting etching the replacement fin structure selectively to the encapsulating dielectric to provide a fin opening having a geometry dictated by the encapsulating dielectric that exposes a growth surface of the substrate, in accordance with one embodiment of the present disclosure.
Figure 4B:
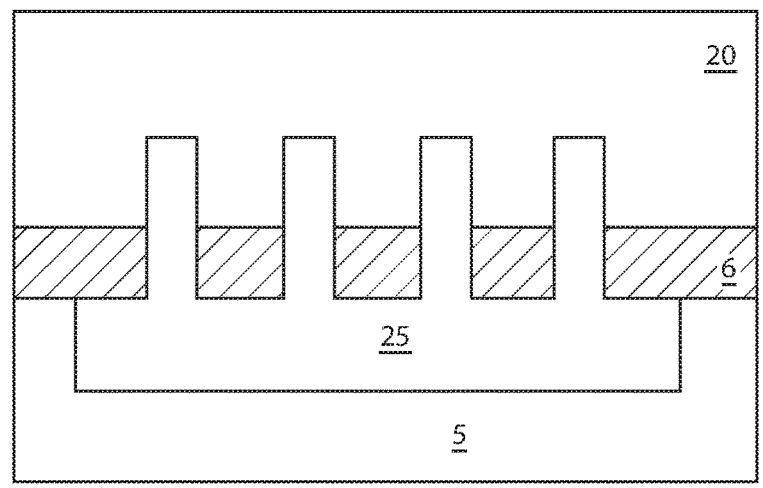
FIG. 4B is a side cross-sectional view along section line A-A of FIG. 4A.
Figure 4C:
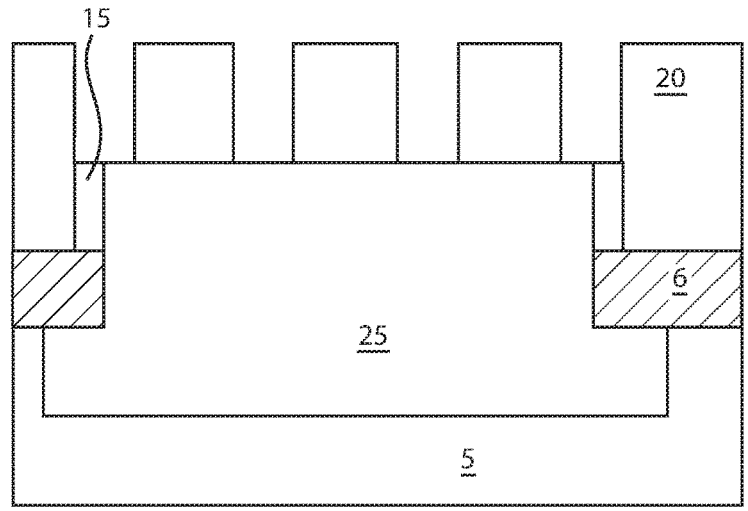
FIG. 4C is a side cross-sectional view along section line B-B of FIG. 4A.
Figure 4D:
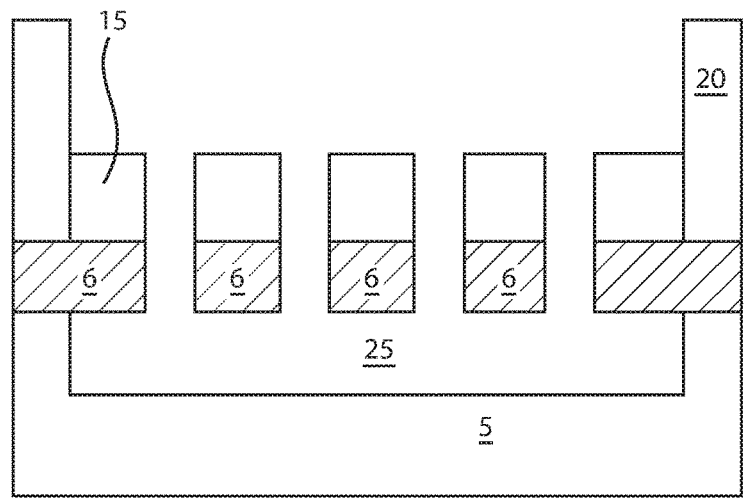
FIG. 4D is a side cross-sectional view along section line C-C of FIG. 4A.
Figure 5A:
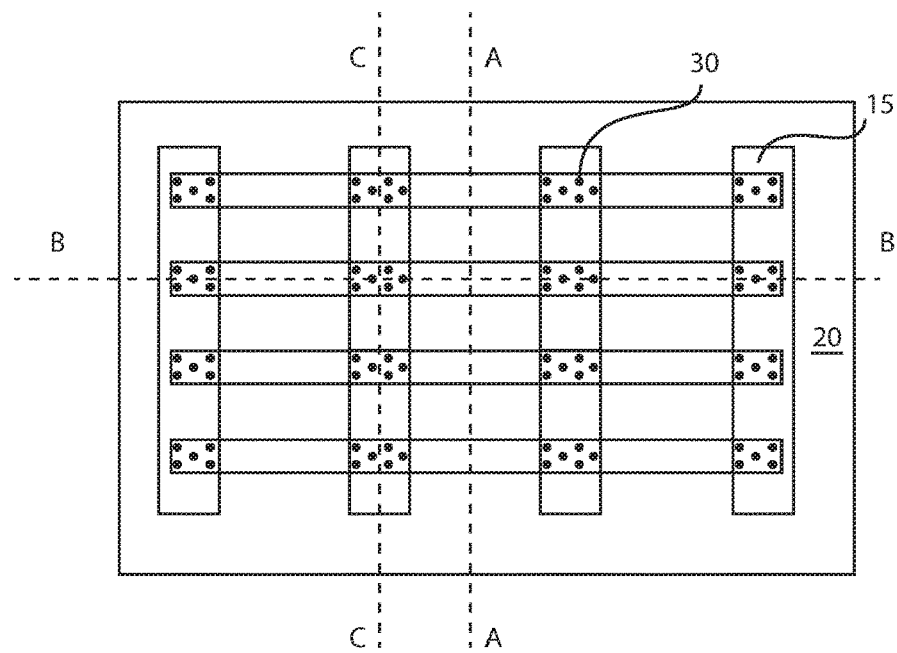
FIG. 5A is a top down planar view depicting epitaxially growing functional fin structures of a second semiconductor material on the growth surface of the substrate substantially filling the fin opening, in accordance with one embodiment of the present disclosure.
Figure 5B:
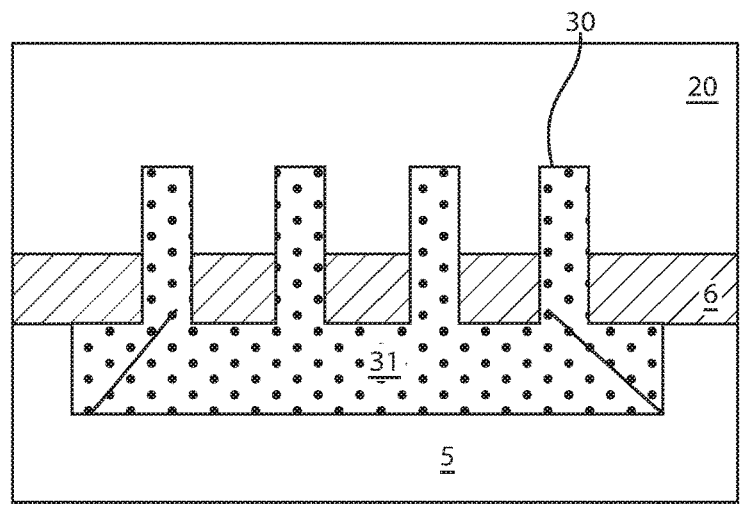
FIG. 5B is a side cross-sectional view along section line A-A of FIG. 5A.
Figure 5C:
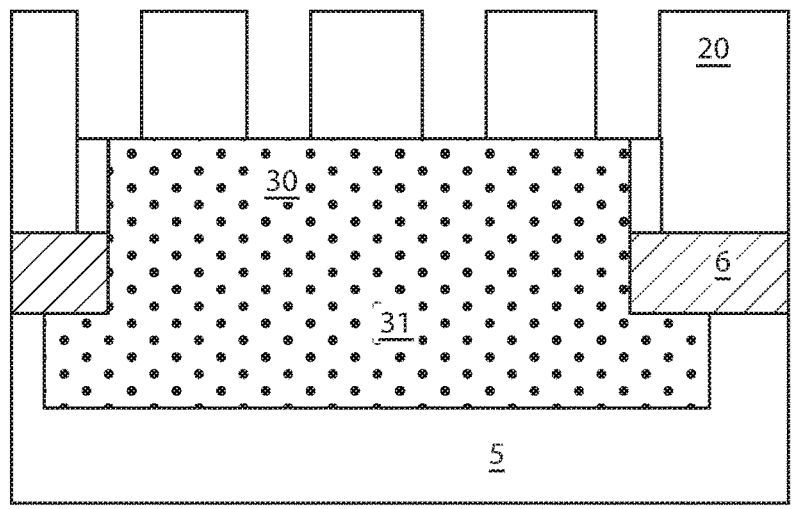
FIG. 5C is a side cross-sectional view along section line B-B of FIG. 5A.
Figure 5D:
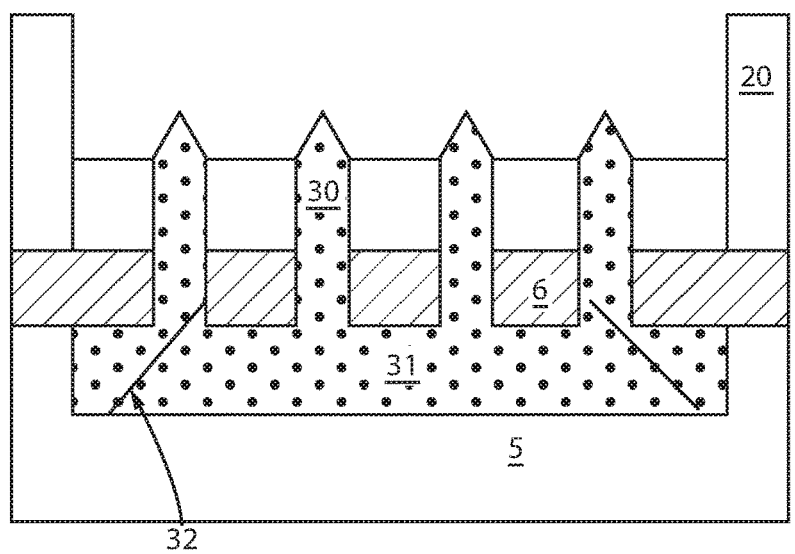
FIG. 5D is a side cross-sectional view along section line C-C of FIG. 5A.
Figure 6A:
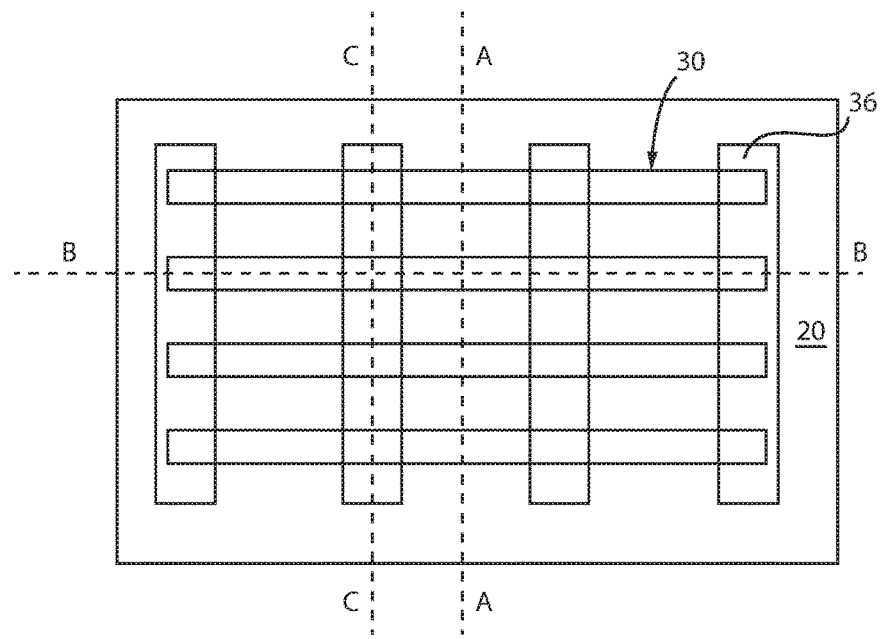
FIG. 6A is a top down view planar view depicting replacing a remaining portion of the replacement gate structure with a functional gate structure, in accordance with one embodiment of the present disclosure.
Figure 6B:
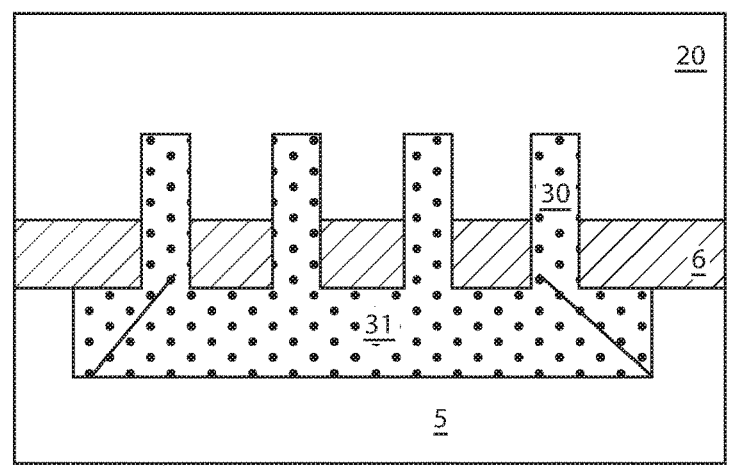
FIG. 6B is a side cross-sectional view along section line A-A of FIG. 6A.
Figure 6C:
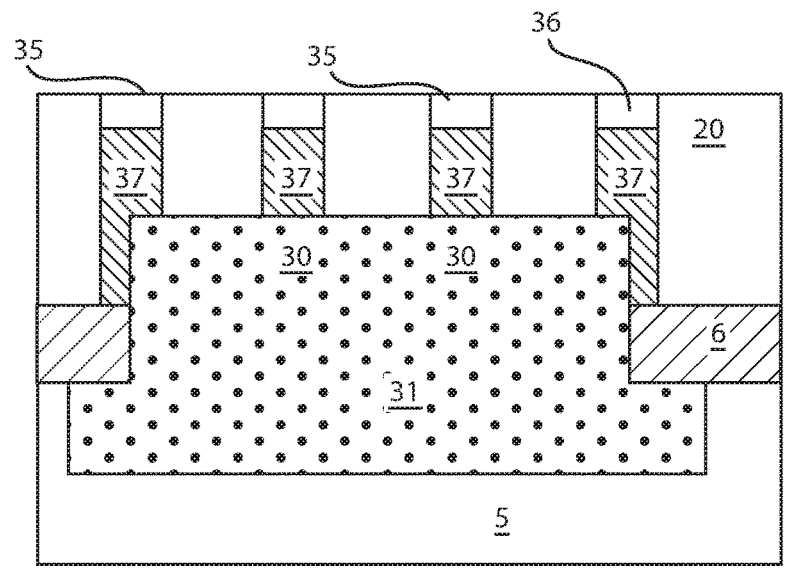
FIG. 6C is a side cross-sectional view along section line B-B of FIG. 6A.
Figure 6D:
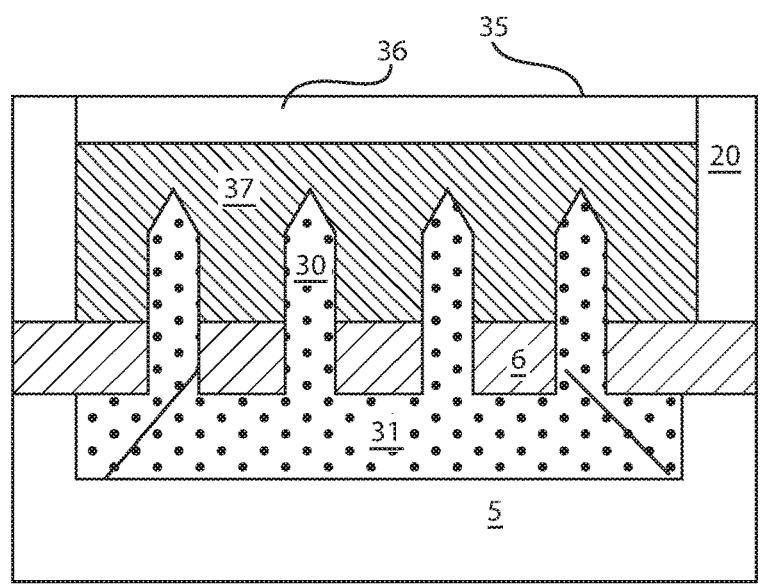
FIG. 6D is a side cross-sectional view along section line C-C of FIG. 6A.
Figure 7A:
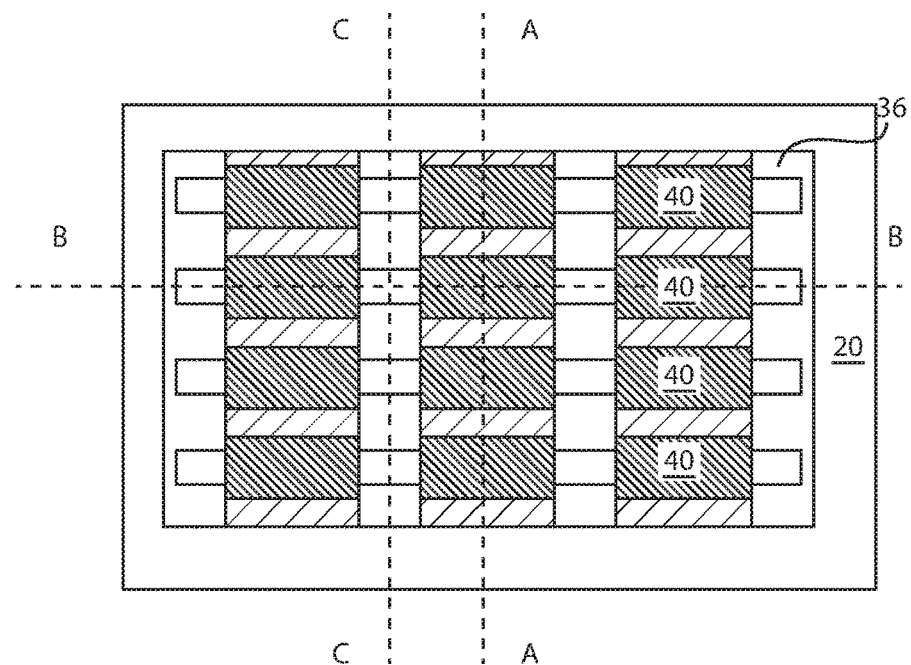
FIG. 7A is a top down view planar view depicting forming source and drain regions on source and drain portions of the functional fin structure, in accordance with one embodiment of the present disclosure.
Figure 7B:
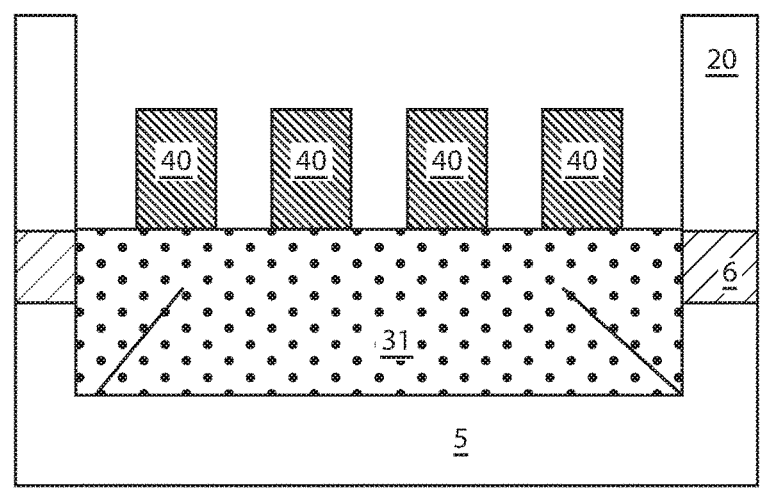
FIG. 7B is a side cross-sectional view along section line A-A of FIG. 7A.
Figure 7C:
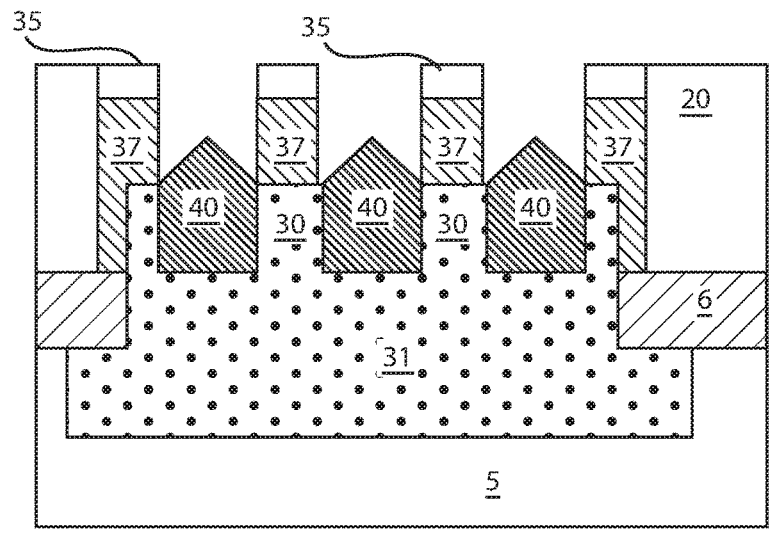
FIG. 7C is a side cross-sectional view along section line B-B of FIG. 7A.
Figure 7D:
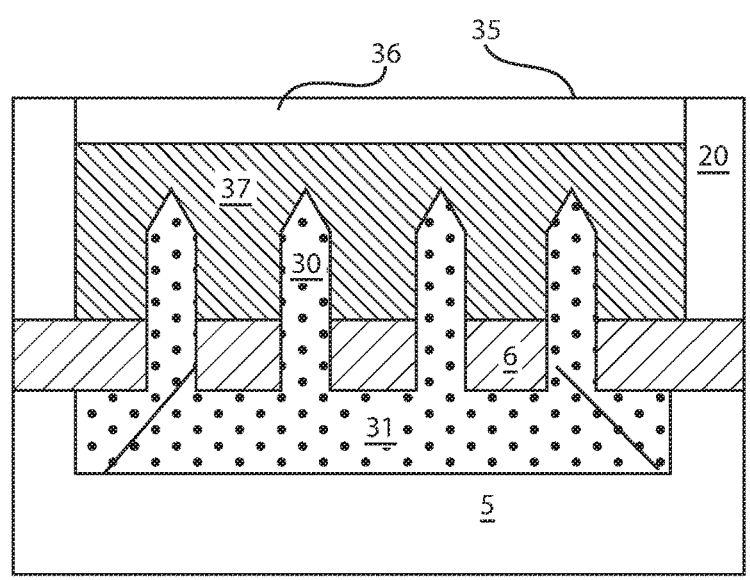
FIG. 7D is a side cross-sectional view along section line C-C of FIG. 7A.
Figure 8A:
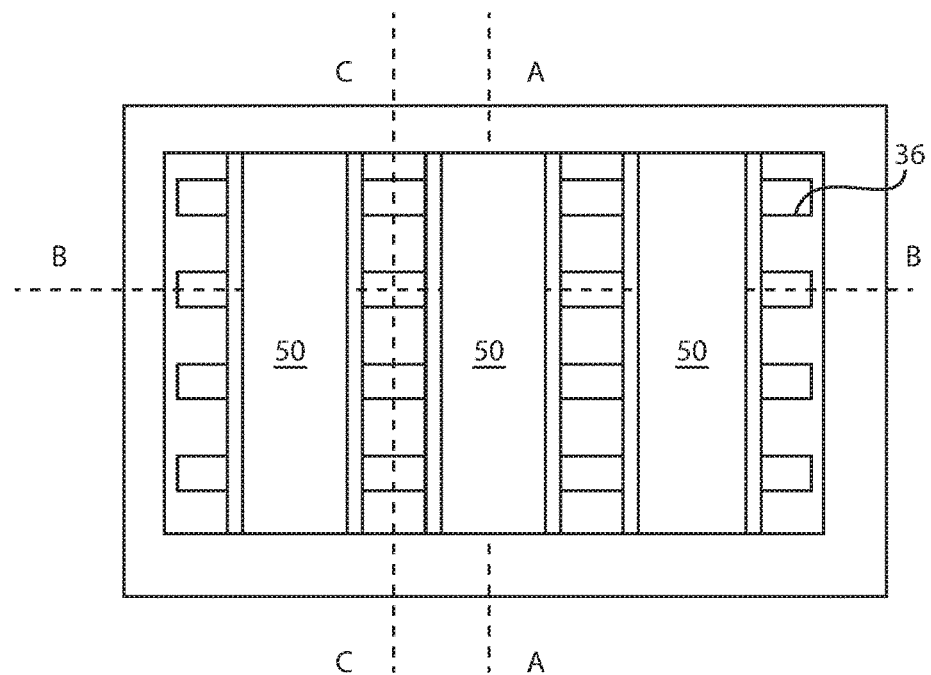
FIG. 8A is a top down view planar view source and drain metallization process steps, in accordance with one embodiment of the present disclosure.
Figure 8B:
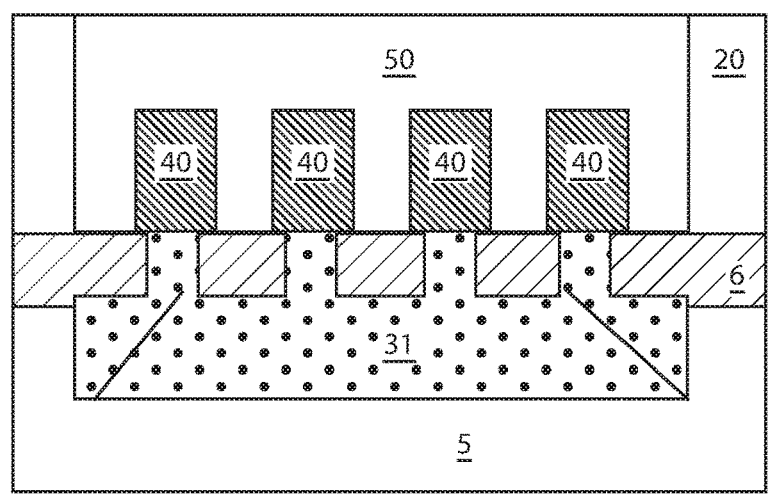
FIG. 8B is a side cross-sectional view along section line A-A of FIG. 8A.
Figure 8C:
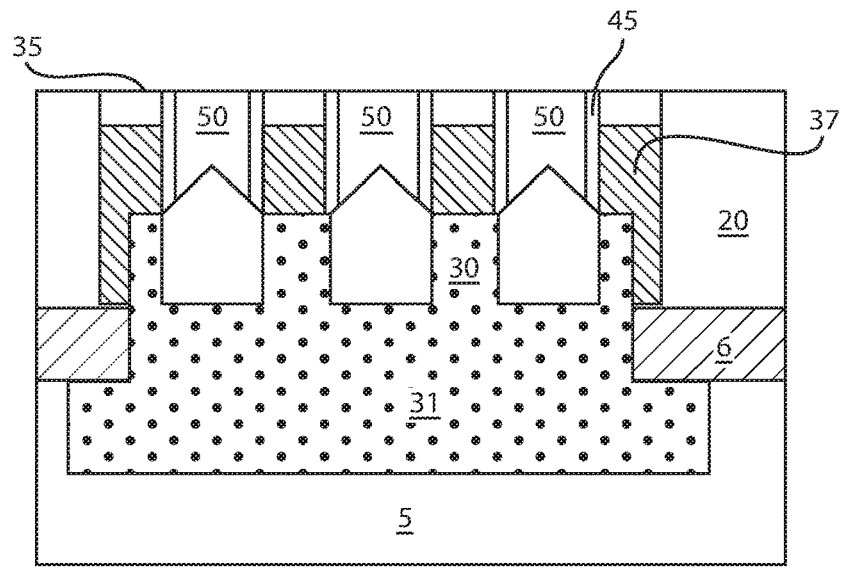
FIG. 8C is a side cross-sectional view along section line B-B of FIG. 8A.
Figure 8D:
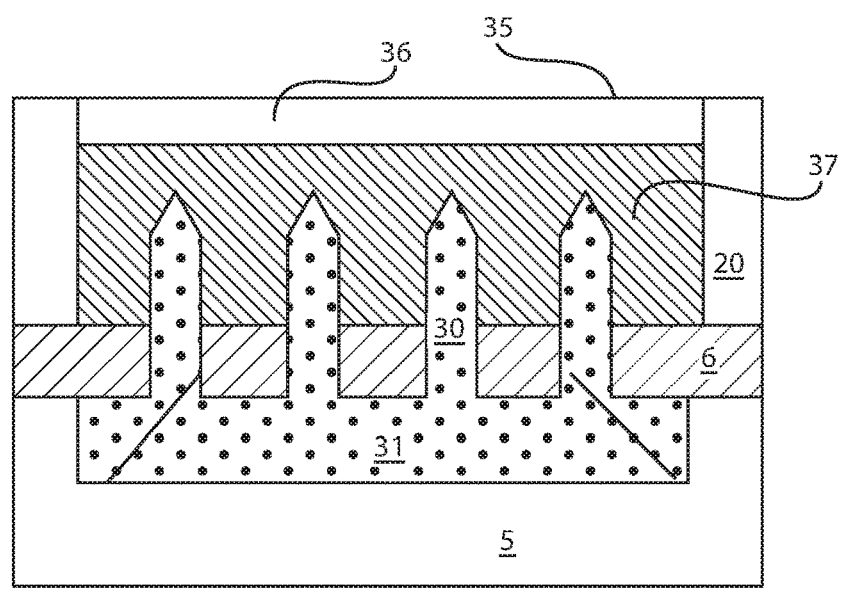
FIG. 8D is a side cross-sectional view along section line C-C of FIG. 8A.

FIGS. 4A-4D depict etching the replacement fin structure 10 selectively to the encapsulating dielectric 20 to provide a fin opening 25 having a geometry dictated by the encapsulating dielectric 20 that exposes a growth surface S1 of the substrate 5. In some embodiments, the etch process for removing the replacement fin structure 10 is an isotropic etch. By isotropic it is meant that the etch process is non-directional. In some embodiments, the etch process for forming the fin opening 25 includes a lateral etching component in addition to a vertical, i.e., recessing, etching component. The isotropic etch can remove the entirety of the replacement fin structures 10, as well as a portion of the semiconductor substrate 5. In some embodiments, by removing a portion of the semiconductor substrate 5 that is underlying the replacement fin structures 10, the isotropic etch produces a trench in the semiconductor substrate 5. In some embodiments, due to the lateral etching component of the isotropic etch, the semiconductor substrate 5 is etched is provide a trench having a width W2 that is greater than the width of the area in which the replacement fin structures 10 were present. In some embodiments, the trench that is formed in the semiconductor substrate 10 joins the spaces formed by removing the replacement fin structures, as depicted in FIG. 4B-4C. Therefore, in some embodiments, the fin opening 25 includes the space formed by removing the replacement fin structures 10, as defined by the encapsulating dielectric 20, and the trench formed in the semiconductor substrate 5 that is joining the replacement fin structures 10.

The isotropic etch for forming the fin opening 25 may be a wet chemical etch. In other embodiments, the isotropic etch for forming the fin opening 25 may be a gas plasma etch. In some embodiments, the isotropic etch for forming the fin opening 25 may remove the semiconductor material, e.g., silicon, of the replacement fin structures 10 and the semiconductor substrate 5 selectively to the encapsulating dielectric 20. The isotropic etch used at this stage of the process flow may also be selective to the remaining portion of the replacement gate structures 15.

The fin opening 25 typically has dimensions suitable for trapping defects when epitaxially growing the crystalline material, e.g., the type III-V semiconductor material of the subsequently formed functional fin structure, using ART (aspect ratio trapping) techniques. In such a case, the aspect ratio (AR—height/width) of the portions of the fin opening 25 provided by removing the replacement fin structures 10 may be greater than 1, although it possible for the aspect ratio to be lower in ART devices, for example, the aspect ratio can be 0.5. (Aspect ratio is defined for trenches as the ratio of the trench height/trench width). In some embodiments, the aspect ratio of the trench is greater than 2:1.

FIGS. 5A-5D depict epitaxially growing functional fin structures 30 of a second semiconductor material on the growth surface S1 of the semiconductor substrate 5 substantially filling the fin opening 25. In some embodiments, the functional fin structures are composed of an epitaxially formed III-V semiconductor material. Examples of compound semiconductor materials that are suitable for providing the composition of an epitaxially formed type III-V semiconductor functional fin structure 30 include at least one of aluminum antimonide (AlSb), aluminum arsenide (AlAs), aluminum nitride (AlN), aluminum phosphide (AlP), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), gallium arsenide antimonide (GaAsSb), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), indium arsenide antimonide phosphide (InArSbP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide aluminum antimonide (GaInNAsSb), gallium indium arsenide antimonide phosphide (GaInAsSbP), and combinations thereof.

The III-V semiconductor material is epitaxially formed filling the trench portion of the fin opening 25 (providing the trench portion of the III-V semiconductor material 31) using the surface of the semiconductor substrate 5 as an epitaxial growth surface. The III-V semiconductor material is epitaxially formed into the portion of the fin opening 25 that was defined by the replacement fins structures 15 to provide the functional fin structures 30. The functional fin structures 30 may have the same height and width dimensions as the replacement fin structures 20. As will be further described below, although defects may be present in the trench portion of the III-V semiconductor material 31, the defects are obstructed from reaching the upper surfaces of the functional fin structures 30 using aspect ratio trapping (ART). Therefore, the type III-V semiconductor functional fin structures 30 are substantially free of defects.

FIGS. 5A-5D depict one embodiment of forming a type III-V semiconductor functional fin structure 30 in the fin openings 25, wherein the aspect ratio of the portions of the fin openings 25 have dimensions defined by the portion of the STI layer 6 and dummy gate 15 formed on the replacement fin structures 10 that trap defects 32 from reaching an upper surface of the III-V semiconductor material that provides the functional fin structures 30. More specifically, in some embodiments, dislocation defects 32 in the type III-V semiconductor material of the trench portion 30 reach and terminate at the sidewalls of the portions of the fin openings 25 having dimensions that were dictated by the replacement fin structures 15, such that dislocations in type III-V semiconductor material that is present in the fin openings 25, which provides the type III-V semiconductor functional fin structures 30, decrease in density with increasing distance from the bottom portion of the trench in the semiconductor substrate 5. Accordingly, the trench portion 31 of the III-V semiconductor material comprises lattice defects 32, and the type III-V semiconductor functional fin structures 30 are substantially free of crystalline defects.

The amount of crystalline defects present at the upper surface of the type III-V semiconductor functional fin structures 30 may be substantially 0. Various crystalline defects such as threading dislocations, stacking faults, twin boundaries, or anti-phase boundaries may thus be substantially eliminated from the crystalline type III-V semiconductor functional fin structures 30.

The type III-V semiconductor material that provides the type III-V semiconductor functional fin structures 30 (as well as the trench portion 31) is formed using an epitaxial deposition process. For example, the type III-V semiconductor material may be formed by selective epitaxial growth in any suitable epitaxial deposition system, including, but not limited to, metal-organic chemical vapor deposition (MOCVD), atmospheric-pressure CVD (APCVD), low- (or reduced-) pressure CVD (LPCVD), ultra-high-vacuum CVD (UHVCVD), molecular beam epitaxy (MBE), or atomic layer deposition (ALD). In the CVD process, selective epitaxial growth typically includes introducing a source gas into the chamber. The source gas may include at least one precursor gas and a carrier gas, such as, for example, hydrogen. The reactor chamber may be heated by, for example, RF-heating. The epitaxial growth system may be a single-wafer or multiple-wafer batch reactor. A number of different sources may be used for the deposition of epitaxial type III-V semiconductor material. In some embodiments, the sources for epitaxial growth of type III-V semiconductor material include solid sources containing In, Ga, N, P elements and combinations thereof and/or a gas precursor selected from the group consisting of trimethylgallium (TMG), trimethylindium (TMI), tertiary-butylphosphine (TBP), phosphine ($PH_3$), ammonia ($NH_3$), and combinations thereof. The temperature for epitaxial deposition of type III-V semiconductor materials typically ranges from 550° C. to 900° C. Although higher temperature typically results in faster deposition, the faster deposition may result in crystal defects and film cracking.

FIGS. 6A-6D depict replacing a remaining portion of the replacement gate structure 15 with a functional gate structure 35. In some embodiments, removing the remaining portion of the replacement gate structure 15 with a functional gate structure 35 may employ a selective etch process. The selective etch process may remove the material of the functional gate structure 35 selectively to the type III-V semiconductor functional fin structures 30 and the encapsulating dielectric 20. In some embodiments, the etch process for removing the remaining portion of the replacement gate structure 15 may be an isotropic etch, such as a wet chemical etch. Removing the replacement gate structure 15 provides a gate opening to the channel region of the type III-V semiconductor functional fin structures 30.

Following removal of the remaining portion of the replacement gate structure, a functional gate structure 35 may be formed in the gate opening. The "functional gate structure" functions to switch the semiconductor device from an "on" to "off" state, and vice versa. The functional gate structure 35 is formed on the channel region of the type III-V semiconductor functional fin structures 30. The functional gate structure 35 typically includes at least a gate dielectric (not shown) that is present on the channel region of the type III-V semiconductor functional fin structures 30, and a gate electrode 37 that is present on the gate dielectric.

In one embodiment, the at least one gate dielectric layer includes, but is not limited to, an oxide, nitride, oxynitride and/or silicates including metal silicates, aluminates, titanates and nitrides. In one example, when the at least one gate dielectric layer is comprised of an oxide, the oxide may be selected from the group including, but not limited to, $SiO_2$, $HfO_2$, $ZrO_2$, $Al_2O_3$, $TiO_2$, $La_2O_3$, $SrTiO_3$, $LaAlO_3$, $Y_2O_3$ and mixture thereof. The physical thickness of the at least one gate dielectric layer may vary, but typically, the at least one gate dielectric layer has a thickness from 1 nm to 10 nm. In another embodiment, the at least one gate dielectric layer has a thickness from 1 nm to 3 nm.

The conductive material of the gate electrode 37 may comprise polysilicon, SiGe, a silicide, a metal or a metal-silicon-nitride such as Ta—Si—N. Examples of metals that can be used as the gate electrode 37 include, but are not limited to, Al, W, Cu, and Ti or other like conductive metals. The layer of conductive material for the gate electrode may be doped or undoped. If doped, an in-situ doping deposition process may be employed. Alternatively, a doped conductive material can be formed by deposition, ion implantation and annealing. In some embodiments, a gate dielectric cap 36 is present atop the gate conductor 37. The gate dielectric cap 36 may be composed of a nitride, such as silicon nitride.

The gate structure 35 may be formed by using a deposition method, such as a chemical vapor deposition method and/or a physical vapor deposition (PVD), to deposit the material layers for the at least one gate dielectric layer and the at least one gate electrode followed by photolithography and etch processing.

FIGS. 7A-7D depict forming source and drain regions 40 on source and drain portions of the functional fin structure, i.e., III-V semiconductor functional fin structures 30. Forming the source and drain regions 40 may begin with removing the encapsulating dielectric 20 from the source and drain region portions of the III-V semiconductor functional fin structures 30. The encapsulating dielectric 20 that is removed to expose the source and drain region portions of the III-V semiconductor functional fin structures 30 may be removed using a selective etch process. For example, the selective etch may remove the material of the encapsulating dielectric 20 selectively to the III-V semiconductor functional fin structures 30. The etch process for exposing the source and drain region portions of the III-V semiconductor functional fin structures 30 may be an anisotropic etch, such as reactive ion etch.

In a following process step, each of the source and drain regions 40 may be epitaxially formed on the source and drain portions of the III-V semiconductor functional fin structures 30, i.e., on opposing sides of the channel region. The epitaxial semiconductor material that provides the source and drain regions 40 may be doped with an n-type or p-type dopant, in which the doping of the source and drain regions 40 typically dictates the conductivity type of the FinFET, e.g., whether the FinFET is a p-type FinFET or an n-type FinFET. For example, in the embodiments in which the source and drain regions 40 are composed of n-type conductivity epitaxial semiconductor material, the FinFET is an n-type device; and in the embodiments in which the source and drain regions 40 are composed of p-type conductivity epitaxial semiconductor material, the FinFET is a p-type device.

In one example, the epitaxial semiconductor material for the source and drain regions 40 may be a type IV or type III-V semiconductor material. It is noted that each of the type IV and type III-V semiconductor materials that have been described above are suitable for use as the epitaxial semiconductor material for the source and drain regions 40. The epitaxial semiconductor material for the source and drain regions 40 may be in situ doped to a p-type or n-type conductivity. The term "in situ" denotes that a dopant, e.g., n-type or p-type dopant, is introduced to the base semiconductor material during the formation of the base material. In one embodiment, in which the source and drain regions 40 are composed of type III-V semiconductor material and are in-situ doped during the epitaxial deposition process to provide the source and drain regions 40 having the p-type or n-type conductivity, the dopant gas may be selected from the group consisting of bis-cyclopentadienyl-magnesium ($Cp_2Mg$), silane ($SiH_4$), disilane ($Si_2H_6$), germane ($GeH_4$), carbon tetrabromide ($CBr_4$) and combinations thereof.

FIGS. 8A-8D depict one embodiment of source and drain metallization process steps that can be used with the methods and structures disclosed herein. In some embodiments, before forming the contacts 50 to the source and drain regions 40, a dielectric spacer 45 may be formed on the sidewalls of the openings to the source and drain regions 40. In one example, the dielectric spacer 45 is composed of a nitride, such as silicon nitride. The dielectric spacer 45 is an optional structure and may be omitted.

The contacts 50 may be produced by filling the via openings to the source and drain regions 40 with an electrically conductive material. The electrically conductive material may be a doped semiconductor material, such as n-type doped polysilicon, or a metal, such as copper, aluminum, titanium, tungsten, platinum or combinations thereof, to form the interconnects 22. The electrically conductive material may be deposited into the openings to the source and drain regions 40 using physical vapor deposition (PVD). Examples of PVD processes suitable for depositing the metal for the interconnects 22 include plating, electroplating, electroless plating, sputtering and combinations thereof.

The method described above provides a semiconductor device, e.g., FinFET, including fin structures 30 comprised of a type III-V semiconductor material that is substantially free of defects. For example, the maximum dislocation density present in the fin structures 30 should be less than $1E^4/cm^2$. The FinFETs disclosed herein also include a semiconductor substrate 5 of a type IV semiconductor material having a trench present therein, in which the plurality of type III-V fin structures 30 are joined by an epitaxial base portion 31 that is present within the trench of the type IV semiconductor material. The epitaxial base portion 31 is in epitaxial relationship with the trench of the type IV semiconductor substrate 5. A gate structure 35 is present on a channel region portion of the type III-V fin structures 30. Source and drain regions 40 are present on source and drain region portions of the type III-V fin structures 30. The source and drain regions 40 may also be composed of type III-V semiconductor material. In some example, the type IV semiconductor material that provides the semiconductor substrate 5 is selected from the group consisting of silicon (Si), germanium (Ge), silicon germanium (SiGe) and combinations thereof. In some examples, the type III-V semiconductor material for the fin structures 30 is selected from the group consisting of indium phosphide (InP), indium gallium arsenic (InGaAs) and combinations thereof. In some embodiments, the type III-V fin structures 30 have a body portion extending from the base that is present within the trench of the substrate 5 with a defect density that ranges from 0 defects/cm$^2$ to $1 \times 10^{10}$ defects/cm$^2$. In some embodiments, the type III-V fin structures 30 have a substrate trench portion 31, i.e., base portion within the trench, with a defect density that ranges from 1 defects/cm$^2$ to $1 \times 10^{11}$ defects/cm$^2$. In one example, the type III-V fin structures 30 have a substrate trench portion 31, i.e., base portion within the trench, with a defect density that ranges from $1 \times 10^{10}$ defects/cm$^2$ to $1 \times 10^{11}$ defects/cm$^2$.

The methods and structures that have been described above with reference to FIGS. 1-8D may be employed in any electrical device. For example, the FinFETs that are disclosed herein may be present within electrical devices that employ semiconductors that are present within integrated circuit chips. The integrated circuit chips including the disclosed interconnects may be integrated with other chips, discrete circuit elements, and/or other signal processing devices as part of either (a) an intermediate product, such as a motherboard, or (b) an end product. The end product can be any product that includes integrated circuit chips, including computer products or devices having a display, a keyboard or other input device, and a central processor.

Having described preferred embodiments of a methods and structures disclosed herein, it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming the fin structure comprising:
    forming a replacement gate structure on a channel region of the at least one replacement fin structure, the replacement fin structure extending from a supporting substrate;
    forming an encapsulating dielectric on the supporting substrate and the at least one replacement gate structure, wherein the encapsulating dielectric encapsulates the replacement fin structure and a portion of the replacement gate structure is exposed;
    etching an exposed portion of the replacement gate structure to provide an opening through the encapsulating dielectric to the replacement fin structure;
    etching the replacement fin structure selectively to the encapsulating dielectric to remove an entirety of the replacement fin structure and to remove a portion of underlying supporting substrate and provide a fin opening having a geometry dictated by the encapsulating dielectric that exposes a growth surface of the substrate; and
    epitaxially growing functional fin structures of a second semiconductor material on the growth surface of the supporting substrate substantially filling the fin opening.

2. The method of claim 1, wherein the fin opening includes a substrate trench portion having a width greater than a fin body portion of said fin opening.

3. The method of claim 2, wherein a difference in width between said substrate trench portion and said fin body portion provides for aspect ratio trapping of defects formed during said epitaxially growing said functional fin structures.

4. The method of claim 3, wherein the aspect ratio trapping provides that a portion of the second semiconductor material in the substrate trench portion includes defects, and a portion of the second semiconductor material formed in the fin body portion of said fin opening is substantially free of defects.

5. The method of claim 4, wherein a defect density of the second semiconductor material in the substrate trench portion ranges from 1 defect/cm$^2$ to $1 \times 10^{11}$ defects/cm$^2$.

6. The method of claim 5, wherein a defect density of the second semiconductor material in the fin body portion ranges from 0 defects/cm$^2$ to $1 \times 10^{10}$ defects/cm$^2$.

7. The method of claim 1, wherein the first semiconductor material is a type IV semiconductor selected from the group consisting of silicon (Si), germanium (Ge), silicon germanium (SiGe) and combinations thereof, and the second semiconductor material is a type III-V semiconductor material selected from the group consisting of indium phosphide (InP), (InGaAs) and combinations thereof.

8. A method of forming a semiconductor device comprising:
- forming a replacement gate structure on a channel region of the at least one replacement fin structure;
- forming an encapsulating dielectric that encapsulates the replacement fin structure leaving a portion of the replacement gate structure exposed;
- etching the portion of the replacement gate structure that is exposed to provide an opening through the encapsulating dielectric to the replacement fin structure;
- etching the replacement fin structure selectively to the encapsulating dielectric to remove an entirety of the replacement fin structure and provide a fin opening;
- functional fin structures of a second semiconductor material are epitaxially grown on a growth surface of the substrate exposed by the fin opening; and
- replacing a remaining portion of the replacement gate structure with a functional gate structure.

9. The method of claim 8 further comprising forming source and drain regions on source and drain portions of the functional fin structure.

10. The method of claim 8, wherein the fin opening includes a substrate trench portion having a width greater than a fin body portion of said fin opening.

11. The method of claim 10, wherein a difference in width between said substrate trench portion and said fin body portion provides for aspect ratio trapping of defects formed during said epitaxially growing said functional fin structures.

12. The method of claim 11, wherein the aspect ratio trapping provides that a portion of the second semiconductor material in the substrate trench portion includes defects, and a portion of the second semiconductor material formed in the fin body portion of said fin opening is substantially free of defects.

13. The method of claim 12, wherein a defect density of the second semiconductor material in the substrate trench portion ranges from 1 defects/cm$^2$ to $1\times10^{11}$ defects/cm$^2$.

14. The method of claim 13, wherein a defect density of the second semiconductor material in the fin body portion ranges from 0 defects/cm$^2$ to $1\times10^{10}$ defects/cm$^2$.

15. The method of claim 8, wherein the first semiconductor material is a type IV semiconductor selected from the group consisting of silicon (Si), germanium (Ge), silicon germanium (SiGe) and combinations thereof, and the second semiconductor material is a type III-V semiconductor material selected from the group consisting of indium phosphide (InP), indium gallium arsenic (InGaAs) and combinations thereof.

* * * * *